United States Patent
Yamaguchi et al.

(10) Patent No.: US 6,784,010 B2
(45) Date of Patent: Aug. 31, 2004

(54) NITRIDE-BASED SEMICONDUCTOR LASER DEVICE AND METHOD FOR THE PRODUCTION THEREOF

(75) Inventors: Takashi Yamaguchi, Kanagawa (JP); Takashi Kobayashi, Kanagawa (JP); Toshimasa Kobayashi, Kanagawa (JP); Satoru Kijima, Miyagi (JP); Satoshi Tomioka, Kanagawa (JP); Shinichi Ansai, Miyagi (JP); Tsuyoshi Tojo, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/275,497

(22) PCT Filed: Feb. 28, 2002

(86) PCT No.: PCT/JP02/01838

§ 371 (c)(1),
(2), (4) Date: Nov. 6, 2002

(87) PCT Pub. No.: WO02/071561

PCT Pub. Date: Sep. 12, 2002

(65) Prior Publication Data

US 2003/0138981 A1 Jul. 24, 2003

(30) Foreign Application Priority Data

Mar. 6, 2001 (JP) ........................................ 2001-061763
Feb. 22, 2002 (JP) ........................................ 2002-045986

(51) Int. Cl.⁷ .............................................. H01L 21/00
(52) U.S. Cl. ........................................ 438/39; 438/46
(58) Field of Search ............................... 438/39, 42, 44, 438/46, 47, 572, 573, 576; 257/95, 99, 623

(56) References Cited

U.S. PATENT DOCUMENTS 6,482,665 B1 * 11/2002 Chu et al. ................... 438/32

FOREIGN PATENT DOCUMENTS

| JP | 10-242587 | | 9/1998 | |
| JP | 2000196201 A | * | 7/2000 | ........... H01S/5/343 |
| JP | 2000-223781 | | 8/2000 | |
| JP | 2000-299528 | | 10/2000 | |
| JP | 2000-323751 | | 11/2000 | |
| JP | 2001-57461 | | 2/2001 | |

* cited by examiner

Primary Examiner—Kevin M. Picardat

(57) ABSTRACT

The nitride-based semiconductor laser device 10 has a stacked structure comprising a first contacting layer 14, a first cladding layer 16, an active layer 20, a second cladding layer 24, a second contacting layer 26 and a second electrode 30 which are consecutively stacked, the second cladding layer 24 comprises a lower layer 24A and an upper layer 24B, the first cladding layer 14, the active layer 20 and the lower layer 24A of the second cladding layer have a mesa structure, the upper layer 24B of the second cladding layer and the second contacting layer 26 have a ridge structure, an insulating layer 40 covering at least part of each of both side surfaces of the upper layer 24B of the second cladding layer is formed on the portions of the lower layer 24A of the second cladding layer which portions correspond to the top surface of the mesa structure, and further, a metal layer 42 having substantially the same width as the mesa structure is formed on the top surface of the insulating layer 40 and the top surface of the second electrode 30 such that the metal layer 42 continues from one top surface to the other.

9 Claims, 10 Drawing Sheets

[STEP-100]

[STEP-110]

[STEP-110] CONTINUED

[STEP-120]

[STEP-130]

[STEP-130] CONTINUED

[STEP-140]

[STEP-140] CONTINUED

[STEP-150]

[STEP-160]

[STEP-160] CONTINUED

NITRIDE-BASED SEMICONDUCTOR LASER DEVICE AND METHOD FOR THE PRODUCTION THEREOF

TECHNICAL FIELD

The present invention relates to a nitride-based semiconductor laser device and a method for the production thereof, and more specifically to a nitride-based semiconductor laser device having an operation voltage controlled to be a desired value and having excellent lateral mode stability, and a method for the production of a nitride-based semiconductor laser device having an operation voltage controlled to be a desired value and having excellent lateral mode stability, in which the production process is simplified.

BACKGROUND ART

A GaN-based semiconductor laser device having a stacked structure of GaN-based compound semiconductor layers formed on a sapphire substrate or a GaN substrate is evoking much interest as a light-emitting device that emits light in a short wavelength region from an ultraviolet region to green.

The constitution of a GaN-based semiconductor laser device 100 disclosed in JP-A-2000-196201 will be explained below with reference to FIG. 10 showing a schematic partial cross-sectional view of a conventional index-guide type GaN-based semiconductor laser device.

The GaN-based semiconductor laser device 100 disclosed in JP-A-2000-196201 has a stacked structure in which, on a substrate 12 made, for example, of a sapphire substrate having a c-surface as a main surface, a first contacting layer 14 made of n-type GaN, a first cladding layer 16 made of n-type AlGaN, a first light-guiding layer 18 made of n-type InGaN, an active layer 20 having a multiple quantum well structure of GaN/InGaN, a degradation-preventing layer 21 made of AlGaN for preventing the degradation of the active layer 20, a second light-guiding layer 22 made of p-type InGaN, a second cladding layer 24 made of p-type AlGaN and a second contacting layer 26 made of p-type GaN are consecutively stacked. There are many cases where a buffer layer (not shown) made of GaN is grown on the substrate 12 at a low temperature, a substratum layer (not shown) made of GaN is laterally grown on the buffer layer, and then, the first contacting layer 14 is grown. There are also some cases where the first light-guiding layer 18 and the second light-guiding layer 22 are not provided, nor is the degradation-preventing layer 21 provided.

The upper layer 24B of the second cladding layer 24 and the second contacting layer 26 have, for example, a ridge structure extending unidirectionally in the form of a stripe. Further, part of the first contacting layer 14, the first cladding layer 16, the first light-guiding layer 18, the active layer 20, the degradation-preventing layer 21, the second light-guiding layer 22 and the lower layer 24A of the second cladding layer 24 have, for example, a mesa structure extending in the form of a stripe and in the same direction as the extending direction of the ridge structure. That is, the thus-structured GaN-based semiconductor laser device 100 satisfies $W'_1 > W'_2$ wherein $W'_1$ is a width of the mesa structure and $W'_2$ is a width of the ridge structure.

The ridge structure, the mesa structure and portions of the first contacting layer 14 positioned on both sides of the mesa structure are covered with a protection layer 28 made of $SiO_2$ except for a second opening portion 28A formed on the topmost surface of the ridge structure (i.e., top surface of the second contacting layer 26) and a first opening portion 28B formed on part of the first contacting layer 14. On the second contacting layer 26 positioned in a bottom of the second opening portion 28A, a second electrode 30 having a multi-layered structure of Ti/Au (Ti forms a lower layer and Au forms an upper layer) is provided as an ohmic contact electrode. In the explanation of the multi-layered structure, a material before "/" forms a lower layer and a material after "/" forms an upper layer, and "/" will be used in this sense hereinafter. Further, on the first contacting layer 14 positioned in a bottom of the first opening portion 28B, a first electrode 32 having a multi-layered structure of Ti/Al is provided as an ohmic contact electrode. In addition, provided on the second electrode 30 and the first electrode 32 are a second pad electrode 34 and a first pad electrode 36 that are electrically connected to the second electrode 30 and the first electrode 32, respectively, as leading electrodes. The second pad electrode 34 extends from the second electrode 30 to the top surface of the protection layer 28.

In the above-structured GaN-based semiconductor laser device 100 disclosed in JP-A-2000-196201, the upper layer 24B of the second cladding layer 24 and the second contacting layer 26 have the ridge structure, so that the current passage of electric current injected is limited to decrease the operation current, and that the lateral mode is controlled by means of an effective refractive index difference $\Delta n$ in a lateral direction. The effective refractive index difference $\Delta n$ refers to a difference ($\Delta n = n_{EFF1} - n_{EFF2}$) between an effective refractive index $n_{EFF1}$ obtained by measurement along the line A—A in FIG. 10 and an effective refractive index $n_{EFF2}$ obtained by measurement along the line B—B in FIG. 10.

The above GaN-based semiconductor laser device disclosed in JP-A-2000-196201 has the following problems.

The first problem is that the operation voltage of the GaN-based semiconductor laser device 100 comes to be higher than a desired value or a designed value.

The second problem is as follows. The lateral mode is controlled by means of the effective refractive index difference $\Delta n$ in a lateral direction. However, it is difficult to increase the thickness of the upper layer 24B of the second cladding layer 24 and it is difficult to decrease the thickness of the lower layer 24A of the second cladding layer 24, so that the effective refractive index difference $\Delta n$ in a lateral direction is small, and that the stability of the lateral mode is therefore poor. When the upper layer 24B of the second cladding layer 24 is increased in thickness and when the lower layer 24A thereof is decreased in thickness, leak current may flow through the protection layer 28 and the lower layer 24A of the second cladding layer 24.

The third problem is that the process which follows the formation of the stacked structure of GaN-based epitaxial growth layers is complicated and includes many steps, so that it is difficult to improve the productivity. After the formation of the stacked structure, for example, the process requires the steps of forming an etching mask made of $SiO_2$, etching the second contacting layer 26 and further etching an upper portion of the second cladding layer 24 to form the ridge structure; the steps of forming a $ZrO_2$ film on the entire surface and removing the $ZrO_2$ film on the etching mask by removing the etching mask to expose the second contacting layer 26; the steps of forming an etching mask made of $SiO_2$ again on the top surface the ridge structure, etching the lower layer of the second cladding layer and each layer positioned below said layer in the stacked structure to form the mesa structure, further, exposing the first contacting layer 14 and then removing the etching mask; and the step of forming the second electrode 30 on the exposed second contacting layer 26.

JP-A-2000-307184 discloses another method of producing a GaN-based semiconductor laser device. In the second embodiment of the method of producing a GaN-based semiconductor laser device disclosed in the above JP-A-2000-307184, after the formation of a stacked structure of GaN-based epitaxial growth layers, first, the stacked structure is etched to form a mesa structure. Then, a protection layer is formed on the entire surface, an opening portion is formed in the protection layer, an second electrode is formed on the top surface of the second contacting layer positioned in a bottom portion of the opening portion, and then the protection layer is removed. Then, while using the second electrode as an etching mask, the second contacting layer and part of the second cladding layer are etched to form a ridge structure. Then, an insulating layer is formed on the entire surface, and the insulating layer on the second electrode is removed to expose the top surface of the second electrode.

In the above method of producing a GaN-based semiconductor laser device disclosed in JP-A-2000-307184, first, the stacked structure is etched to form the mesa structure. In this case, the top surface of the second contacting layer that is to be a contact surface to the second electrode may be contaminated. Further, there is involved a problem that it is difficult to form a thick insulating layer on both side surfaces of the upper layer of the second cladding layer having the ridge structure.

It is therefore an object of the present invention to provide a nitride-based semiconductor laser device that operates at a low voltage and has excellent lateral mode stability, and a method for producing a nitride-based semiconductor laser device in which the above nitride-based semiconductor laser device can be produced by a process having steps decreased in number.

DISCLOSURE OF THE INVENTION

The present inventors have made diligent studies to overcome the first problem. The studies have revealed the following. The top surface of the second contacting layer 26 (contact surface to the second electrode) is contaminated, and, as a result, the contact resistance between the second contacting layer and the second electrode 30 increases, so that the operation voltage increases. It has been found that the contamination of the top surface of the second contacting layer 26 (contact surface to the second electrode) is caused by the existence of the step of forming the mesa structure and some other steps between exposure of the second contacting layer 26 and formation of the second electrode 30 on the second contacting layer 26, concerning the third problem. The following has been further found. The second electrode 30 and the second contacting layer 26 are liable to undergo displacement each other, and as a result, the contact area between the second contacting layer 26 and the second electrode 30 decreases, so that the operation voltage increases. Further, it has been found that the effective refractive index difference Δn in a lateral direction is small in the conventional GaN-based semiconductor laser device and is therefore not much effective for controlling the lateral mode, which causes the second problem. For overcoming the third problem, attention has been given to the fact that the number of steps of producing a nitride-based semiconductor laser device can be decreased by modifying the steps of forming and removing an etching mask for forming the ridge structure and forming and removing an etching mask for forming the mesa structure.

The nitride-based semiconductor laser device of the present invention for achieving the above object comprises;

(A) a first contacting layer formed on a substrate, (B) a first electrode formed on the first contacting layer, (C) a first cladding layer formed on the first contacting layer, (D) an active layer formed on the first cladding layer, (E) a second cladding layer formed on the active layer, (F) a second contacting layer formed on the second cladding layer, and (G) a second electrode formed on the second contacting layer, the second cladding layer comprising a lower layer and an upper layer, the first contacting layer, the first cladding layer, the active layer, the second cladding layer and the second contacting layer being composed of a nitride-based compound semiconductor layer each, the first cladding layer, the active layer and the lower layer of the second cladding layer having a mesa structure, the upper layer of the second cladding layer and the second contacting layer having a ridge structure having a smaller width than the mesa structure, the second electrode having substantially the same width as the second contacting layer has in the interface of the second contacting layer and the electrode, an insulating layer being formed on the portions of the lower layer of the second cladding layer which portions correspond to the top surface of the mesa structure, said insulating layer covering at least part of each of both side surfaces of the upper layer of the second cladding layer, and a metal layer being formed on the top surface of the insulating layer and the top surface of the second electrode such that the metal layer continues from the top surface of the insulating layer to the top surface of the second electrode, said metal layer having substantially the same width as the mesa structure has.

In the index-guide type nitride-based semiconductor laser device of the present invention, the phrase "the metal layer having substantially the same width as the mesa structure has" means that the width of the mesa structure and the width of the metal layer are equal to each other within a tolerance of fluctuation dependent upon processing accuracy in the production steps of the nitride-based semiconductor laser device. Further, the phrase "the second electrode having substantially the same width as the second contacting layer has in the interface of the second contacting layer and the second electrode" means that the second electrode has the same width as the second contacting layer has within a tolerance of fluctuation dependent upon processing accuracy in the production steps of the nitride-based semiconductor laser device. When the ridge structure has slanting side surfaces, the width of the ridge structure stands for the largest width of the ridge structure. That is, it refers to a width of the upper layer in the interface of the upper layer and the lower layer of the second cladding layer. When the laser beam travel direction of the nitride-based semiconductor laser device is taken as an X axis and when the thickness direction of the nitride-based semiconductor laser device (the direction of a normal line with regard to the substrate surface) is taken as a Z axis, the side surface of the mesa structure, the side surface of the ridge structure or the side surface of each layer means a surface that constitutes an outer surface thereof and crosses a Y axis. Further, the width of the mesa structure, the width of the ridge structure or the width of each layer means a length obtained along the Y-axis.

In the nitride-based semiconductor laser device of the present invention, there may be employed a constitution in which a protection layer is formed on the surface of the first contacting layer and is formed on the side surfaces of the mesa structure and the top surface of the metal layer, such that the protection layer continues from the first contacting layer through the side surfaces of the mesa structure to the top surface of the metal layer; a first opening portion is formed in a portion of the protection layer formed on the surface of the first contacting layer; the first electrode is formed on the first contacting layer exposed in the bottom of the first opening portion; a first pad electrode is formed on the first electrode; a second opening portion is formed in a portion of the protection layer on the metal layer on the second electrode; and a second pad electrode is formed on the exposed portion of the metal layer.

The method for the production of a nitride-based semiconductor laser device, provided by the present invention, for achieving the above object is a method for the production of a nitride-based semiconductor laser device comprising;

(A) a first contacting layer formed on a substrate,
(B) a first electrode formed on the first contacting layer,
(C) a first cladding layer formed on the first contacting layer,
(D) an active layer formed on the first cladding layer,
(E) a second cladding layer formed on the active layer,
(F) a second contacting layer formed on the second cladding layer, and
(G) a second electrode formed on the second contacting layer, the second cladding layer comprising a lower layer and an upper layer, the first contacting layer, the first cladding layer, the active layer, the second cladding layer and the second contacting layer being composed of a nitride-based compound semiconductor layer each, the first cladding layer, the active layer and the lower layer of the second cladding layer having a mesa structure, the upper layer of the second cladding layer and the second contacting layer having a ridge structure having a smaller width than the mesa structure, the second electrode having substantially the same width as the second contacting layer has in the interface of the second contacting layer and the second electrode, an insulating layer being formed on the portions of the lower layer of the second cladding layer which portions correspond to the top surface of the mesa structure, said insulating layer covering at least part of each of both side surfaces of the upper layer of the second cladding layer, and a metal layer being formed on the top surface of the insulating layer and the top surface of the second electrode such that the metal layer continues from the top surface of the insulating layer to the top surface of the second electrode, said metal layer having substantially the same width as the mesa structure has, said method comprising the steps of;

(a) consecutively depositing the first contacting layer, the first cladding layer, the active layer, the second cladding layer and the second contacting layer on the substrate, and then forming the second electrode having substantially the same width as the second contacting layer to be formed, on the second contacting layer,
(b) while using the second electrode as an etching mask, etching the second contacting layer and further partly etching the second cladding layer in the second cladding layer thickness direction, to form the second contacting layer and the upper layer of the second cladding layer having the ridge structure and to form the lower layer of the second cladding layer having top surfaces of which are exposed on both sides of the upper layer of the second cladding layer,
(c) forming the insulating layer on the portions of the lower layer of the second cladding layer on which portions no upper layer of the second cladding layer is formed, so as to cover at least part of each of both side surfaces of the upper layer of the second cladding layer and expose the top surface of the second electrode,
(d) forming the metal layer having substantially the same width as the width of the mesa structure to be formed, on the insulating layer and the top surface of the second electrode such that the metal layer continues from the surface of the insulating layer to the top surface of the second electrode, and
(e) while using the metal layer as an etching mask, etching at least the insulating layer, the lower layer of the second cladding layer, the active layer and the first cladding layer, to form the mesa structure.

In the method for the production of an index-guide type nitride-based semiconductor laser device, provided by the present invention, the phrase "the metal layer having substantially the same width as the mesa structure has" means that the width of the mesa structure and the width of the metal layer are equal to each other within a tolerance of fluctuation dependent upon processing accuracy in the production steps of the nitride-based semiconductor laser device. Further, the phrase "the second electrode having substantially the same width as the second contacting layer to be formed" means that the second electrode has the same width as the second contacting layer has, in the interface of the second contacting layer and the second electrode, within a tolerance of fluctuation dependent upon processing accuracy in the production steps of the nitride-based semiconductor laser device. When the ridge structure has a slanting side surface, the width of the ridge structure stands for the largest width of the ridge structure. That is, it refers to a width of the upper layer in the interface of the upper layer and the lower layer of the second cladding layer. When the laser beam travel direction of the nitride-based semiconductor laser device is taken as an X axis and when the thickness direction of the nitride-based semiconductor laser device (the direction of a normal line with regard to the substrate surface) is taken as a Z axis, the side surface of the mesa structure, the side surface of the ridge structure or the side surface of each layer means a surface that constitutes an outer surface thereof and crosses a Y axis. Further, the width of the mesa structure, the width of the ridge structure or the width of each layer means a length obtained along the Y-axis.

In the method for the production of a nitride-based semiconductor laser device, provided by the present invention, in the step (e), preferably, the etching of the first cladding layer is followed by partly etching the first contacting layer in the thickness direction thereof.

The method for the production of a nitride-based semiconductor laser device, provided by the present invention, may have a constitution in which, after the step (e), the formation of a protection layer on the surface of the first contacting layer, the side surfaces of the mesa structure and the top surface of the metal layer, such that the protection layer continues from the surface of the first contacting layer through the side surfaces of the mesa structure to the top surface of the metal layer, is further followed by the steps of;

①  forming a first opening portion in a portion of the protection layer formed on the surface of the first contacting layer, ②  forming a first electrode on the exposed first contacting layer, ③  forming a first pad electrode on the first electrode, ④  forming a second opening portion in the protection layer on the metal layer on the second electrode, and ⑤  forming a second pad electrode on the exposed portion of the metal layer.

The order in which the above steps ① to ⑤ are carried out includes the following orders.

① ⟶ ② ⟶ ③ ⟶ ④ ⟶ ⑤

① ⟶ ② ⟶ ④ ⟶ ⑤ ⟶ ③

④ ⟶ ⑤ ⟶ ① ⟶ ② ⟶ ③

The material for the protection layer includes $SiO_2$, $SiN_x$, AlN, $Al_2O_3$, $Ta_2O_5$, $ZrO_2$, ZnO, SiON, $HfO_2$, $Sc_2O_3$, $Y_2O_3$ and MgO.

In the nitride-based semiconductor laser device of the present invention or the method for the production thereof, any insulating layer will do so long as it is formed on the portions of the lower layer of the second cladding layer on which portions no upper layer of the second cladding layer is formed, such that the insulating layer covers at least part of each of both side surfaces of the upper layer of the second cladding layer. Specifically, the embodiment of the insulating layer includes;

(1) an embodiment in which the insulating layer covers a lower portion of each of both side surfaces of the upper layer of the second cladding layer, and (2) an embodiment in which the insulating layer covers at least each of both side surfaces of the upper layer of the second cladding layer.

More specifically, the embodiment (2) in which the insulating layer covers at least each of both side surfaces of the upper layer of the second cladding layer includes;

(2-1) an embodiment in which the insulating layer covers each of both side surfaces of the upper layer of the second cladding layer, (2-2) an embodiment in which the insulating layer covers each of both side surfaces of the upper layer of the second cladding layer and further covers a lower portion of each of both side surfaces of the second contacting layer, and (2-3) an embodiment in which the insulating layer covers each of both side surfaces of the upper layer of the second cladding layer and further covers each of both side surfaces of the second contacting layer.

Desirably, the above insulating layer formed on the portions of the lower layer of the second cladding layer on which portions no upper layer of the second cladding layer is formed, other than vicinities of both side surfaces of the upper layer of the second cladding layer has generally uniform thickness.

In the method for the production of a nitride-based semiconductor laser device, provided by the present invention, the insulating layer can be formed depending upon the above various embodiments in the above step (c). That is, for example, in the embodiment in which the insulating layer covers at least each of both side surfaces of the upper layer of the second cladding layer, it is sufficient to form the insulating layer on the portions of the lower layer of the second cladding layer on which portions no upper layer of the second cladding layer is formed, such that the insulating layer covers at least each of both side surfaces of the upper layer of the second cladding layer, in the step (c).

In the embodiment in which the insulating layer covers a lower portion of each of both side surfaces of the upper layer of the second cladding layer in the nitride-based semiconductor laser device of the present invention or the method for the production thereof, the metal layer is in contact with an upper portion of each of both side surfaces of the upper layer of the second cladding layer and electric current is injected into the upper layer of the second cladding layer, while no problem is caused. In the above embodiment, however, the insulating layer formed on the portions of the lower layer of the second cladding layer on which portions no upper layer of the second cladding layer is formed has a small thickness, so that light emitted in the active layer may undergo loss, or that a dielectric breakdown may occur between the active layer and the metal layer. It is therefore preferred to employ the embodiment in which the insulating layer covers at least each of both side surfaces of the upper layer of the second cladding layer. When the above embodiment is employed, a dielectric breakdown between the active layer and the metal layer can be reliably prevented even if the thickness of the upper layer of the second cladding layer is increased and even if the thickness of the portions of the lower layer of the second cladding layer on which portions no upper layer of the second cladding layer is formed is decreased. Further, the effective refractive index difference Δn in a lateral direction can be fully increased, and the stability of the lateral mode can be further improved.

In the method for the production of a semiconductor laser device provided by the present invention, in the above step (c), preferably, a photoresist film is formed on the insulating layer after the formation of the insulating layer on the entire surface, such that the photoresist film has a smaller thickness above the second electrode and has a larger thickness above the portions of the lower layer of the second cladding layer on which portions no upper layer of the second cladding layer is formed, and then the photoresist film and the insulating layer at least on the second electrode are etched to expose at least the top surface (contact surface to the metal layer) of the second electrode. That is, preferably, a height difference between the second electrode and the lower layer of the second cladding layer is utilized, and the second electrode is allowed to work as an etching stop layer, thereby to expose at least the top surface (contact surface to the metal layer) of the second electrode. By the above procedure, a large-thickness insulating layer can be formed on both side surfaces of the upper layer of the second cladding layer having a ridge structure.

In the nitride-based semiconductor laser device of the present invention including the above preferred embodiments or the method for the production thereof, the thickness $T_{INSL}$ of a portion of the insulating layer formed on the portions of the lower layer of the second cladding layer which portions correspond to the top surface of the mesa structure (more specifically, thickness of the insulating layer formed on the portions of the lower layer of the second cladding layer on which portions no upper layer of the second cladding layer is formed, other than vicinities of both side surfaces of the upper layer of the second cladding layer) is $5 \times 10^{-8}$ m to $3 \times 10^{-7}$ m, preferably $9 \times 10^{-8}$ m to $2 \times 10^{-7}$ m, in view of the effective refractive index at which a light confinement effect can be exhibited.

Alternatively, in the nitride-based semiconductor laser device of the present invention including the above preferred various embodiments or the method for the production thereof, it is desirable to satisfy $0.4 T_{TOTAL} \leq T_{UPPER} \leq 0.9 T_{TOTAL}$, preferably $0.5 T_{TOTAL} \leq T_{UPPER} \leq 0.8 T_{TOTAL}$, in which $T_{TOTAL}$ is a total thickness of the second cladding layer and $T_{UPPER}$ is a thickness of the upper layer of the second cladding layer. More specifically, $T_{TOTAL}$ is $5 \times 10^{-7}$ m to $1 \times 10^{-6}$ m, preferably $6 \times 10^{-7}$ m to $8 \times 10^{-7}$ m, and $T_{UPPER}$ is $2 \times 10^{-7}$ m to $9 \times 10^{-7}$ m, preferably $3 \times 10^{-7}$ m to $6.4 \times 10^{-7}$ m. In this case, it is desirable to satisfy $0.05 T_{UPPER} \leq T_{INSL}$, preferably $0.1 T_{UPPER} \leq T_{INSL}$ in which $T_{INSL}$ is a thickness of the portion of the insulating layer which portion is formed on the portions of the lower layer of the second cladding layer which portions correspond to the top surface of the mesa structure (more specifically, a thickness of the insulating layer formed on the portions of the lower layer of the second cladding layer on which portions no upper layer of the second cladding layer is formed, other than vicinities of both side surfaces of the upper layer of the second cladding layer).

In the nitride-based semiconductor laser device of the present invention including the above preferred various embodiments or the method for the production thereof, desirably, the insulating layer is made of at least one material selected from the group consisting of $SiO_2$, $SiN_x$, AlN, $Al_2O_3$, $Ta_2O_5$ and $ZrO_2$. The insulating layer may have a single-layered structure or a multi-layered structure composed of these material(s). For preventing damage of the exposed portion of the lower layer of the second cladding layer during the formation of the insulating layer, desirably, the insulating layer made of $SiO_2$, $SiN_x$, $Al_2O_3$ or $ZrO_2$ is formed by a vacuum deposition method, or the insulating layer made of AlN, $Al_2O_3$, $Ta_2O_5$ or $ZrO_2$ is formed by a sputtering method, although the method for forming the insulating layer shall not be limited thereto. In some cases, a silicon layer (specifically, for example, an amorphous silicon layer) may be formed on the insulating layer (specifically, between the insulating layer and the metal layer), for example, by a vacuum deposition method or some other method. The silicon layer works as a light-absorbing layer, and when the silicon layer is formed, absorption to primary-mode light increases, so that the lateral mode can be stabilized.

When the insulating layer is made of $SiO_2$, desirably, the thickness $T_{INSL}$ of the insulating layer made of $SiO_2$ is $2 \times 10^{-8}$ m to $3 \times 10^{-7}$ m, preferably $2 \times 10^{-8}$ m to $2 \times 10^{-7}$ m. When the silicon layer is formed on the insulating layer made of $SiO_2$, the thickness $T_{INSL}$ of the insulating layer made of $SiO_2$ is $2 \times 10^{-8}$ m to $8 \times 10^{-8}$ m, and the thickness of the silicon layer is at least $5 \times 10^{-9}$ m. Preferably, the thickness $T_{INSL}$ of the insulating layer made of $SiO_2$ is $4 \times 10^{-8}$ m to $8 \times 10^{-8}$ m, and the thickness of the silicon layer is at least $5 \times 10^{-9}$ m. More preferably, the thickness $T_{INSL}$ of the insulating layer made of $SiO_2$ is $4 \times 10^{-8}$ m to $8 \times 10^{-8}$ m, and the thickness of the silicon layer is at least $2 \times 10^{-8}$ m.

When the insulating layer is made of $SiN_x$, desirably, the thickness $T_{INSL}$ of the insulating layer made of $SiN_x$ is $2 \times 10^{-8}$ m to $3 \times 10^{-7}$ m, preferably $2 \times 10^{-8}$ m to $2 \times 10^{-7}$ m. When the silicon layer is formed on the insulating layer made of $SiN_x$, the thickness $T_{INSL}$ of the insulating layer made of $SiN_x$ is $2 \times 10^{-8}$ m to $2 \times 10^{-7}$ m, and the thickness of the silicon layer is at least $5 \times 10^{-9}$ m. Preferably, the thickness $T_{INSL}$ of the insulating layer made of $SiN_x$ is $5 \times 10^{-8}$ m to $8 \times 10^{-8}$ m, and the thickness of the silicon layer is at least $5 \times 10^{-9}$ m. More preferably, the thickness $T_{INSL}$ of the insulating layer made of $SiN_x$ is $5 \times 10^{-8}$ m to $8 \times 10^{-8}$ m, and the thickness of the silicon layer is at least $2 \times 10^{-8}$ m.

When the insulating layer is made of AlN, desirably, the thickness $T_{INSL}$ of the insulating layer made of AlN is $2 \times 10^{-8}$ m to $3 \times 10^{-7}$ m, preferably $2 \times 10^{-8}$ m to $2 \times 10^{-7}$ m. When the silicon layer is formed on the insulating layer made of AlN, the thickness $T_{INSL}$ of the insulating layer made of AlN is $2 \times 10^{-8}$ m to $2 \times 10^{-7}$ m, and the thickness of the silicon layer is at least $5 \times 10^{-9}$ m. Preferably, the thickness $T_{INSL}$ of the insulating layer made of AlN is $5 \times 10^{-8}$ m to $1 \times 10^{-7}$ m, and the thickness of the silicon layer is at least $5 \times 10^{-9}$ m. More preferably, the thickness $T_{INSL}$ of the insulating layer made of AlN is $5 \times 10^{-8}$ m to $1 \times 10^{-7}$ m, and the thickness of the silicon layer is at least $2 \times 10^{-8}$ m.

When the insulating layer is made of $Al_2O_3$, desirably, the thickness $T_{INSL}$ of the insulating layer made of $Al_2O_3$ is $2 \times 10^{-8}$ m to $3 \times 10^{-7}$ m, preferably $2 \times 10^{-8}$ m to $2 \times 10^{-7}$ m. When the silicon layer is formed on the insulating layer made of $Al_2O_3$, the thickness $T_{INSL}$ of the insulating layer made of $Al_2O_3$ is $2 \times 10^{-8}$ m to $1.0 \times 10^{-7}$ m, and the thickness of the silicon layer is at least $5 \times 10^{-9}$ m. Preferably, the thickness $T_{INSL}$ of the insulating layer made of $Al_2O_3$ is $4 \times 10^{-8}$ m to $1 \times 10^{-7}$ m, and the thickness of the silicon layer is at least $5 \times 10^{-9}$ m. More preferably, the thickness $T_{INSL}$ of the insulating layer made of $Al_2O_3$ is $4 \times 10^{-8}$ m to $1 \times 10^{-7}$ m, and the thickness of the silicon layer is at least $2 \times 10^{-8}$ m.

When the insulating layer is made of $Ta_2O_5$, desirably, the thickness $T_{INSL}$ of the insulating layer made of $Ta_2O_5$ is $2 \times 10^{-8}$ m to $5 \times 10^{-7}$ m, preferably $2 \times 10^{-8}$ m to $4 \times 10^{-7}$ m. When the silicon layer is formed on the insulating layer made of $Ta_2O_5$, the thickness $T_{INSL}$ of the insulating layer made of $Ta_2O_5$ is $2 \times 10^{-8}$ m to $2 \times 10^{-7}$ m, and the thickness of the silicon layer is at least $5 \times 10^{-9}$ m. Preferably, the thickness $T_{INSL}$ of the insulating layer made of $Ta_2O_5$ is $2 \times 10^{-8}$ m to $1 \times 10^{-7}$ m, and the thickness of the silicon layer is at least $5 \times 10^{-9}$ m. More preferably, the thickness $T_{INSL}$ of the insulating layer made of $Ta_2O_5$ is $2 \times 10^{-8}$ m to $1 \times 10^{-7}$ m, and the thickness of the silicon layer is at least $2 \times 10^{-8}$ m.

When the insulating layer is made of $ZrO_2$, desirably, the thickness $T_{INSL}$ of the insulating layer made of $ZrO_2$ is $2 \times 10^{-8}$ m to $3 \times 10^{-7}$ m, preferably $2 \times 10^{-8}$ m to $2 \times 10^{-7}$ m. When the silicon layer is formed on the insulating layer made of $ZrO_2$, the thickness $T_{INSL}$ of the insulating layer made of $ZrO_2$ is $2 \times 10^{-8}$ m to $2 \times 10^{-7}$ m, and the thickness of the silicon layer is at least $5 \times 10^{-9}$ m. Preferably, the thickness $T_{INSL}$ of the insulating layer made of $ZrO_2$ is $3 \times 10^{-8}$ m to $1.1 \times 10^{-7}$ m, and the thickness of the silicon layer is at least $5 \times 10^{-9}$ m. More preferably, the thickness $T_{INSL}$ of the insulating layer made of $ZrO_2$ is $6 \times 10^{-8}$ m to $1.1 \times 10^{-7}$ m, and the thickness of the silicon layer is at least $2 \times 10^{-8}$ m.

Alternatively, the material for the insulating layer may be at least one material selected from the group consisting of ZnO, SiON, $HfO_2$, $Sc_2O_3$, $Y_2O_3$, MgO, $ThO_2$ and $Bi_2O_3$. The insulating layer may have a single-layered structure or a multi-layered structure composed of these material(s). Further, the insulating layer may have a multi-layered structure composed of a combination of these material(s) and the above-described material(s). The insulating layer may be replaced, for example, with a first-conduction type $Al_xGa_{1-x}N$ ($X \geq 0.02$) layer that works as a current confinement layer. In this case, the second cladding layer is of a second-conduction type. That is, the conduction type of the second cladding layer is p-type, an n-type type $Al_xGa_{1-x}N$ ($X \geq 0.02$) layer can be formed.

In the nitride-based semiconductor laser device of the present invention including the above preferred various embodiments or the method for the production thereof, desirably, the second electrode as an ohmic contact electrode to the second contacting layer has a single-layered structure or a multi-layered structure containing at least one metal selected from the group consisting of palladium (Pd), platinum (Pt), nickel (Ni) and gold (Au), and the metal layer has a single-layered structure or a multi-layered structure containing at least one metal selected from the group consisting of platinum (Pt), titanium (Ti) and nickel (Ni). The thickness of the second electrode is preferably $1\times10^{-8}$ m to $1\times10^{-6}$ m. The thickness of the metal layer is preferably $5\times10^{-8}$ m to $5\times10^{-7}$ m. Since the metal layer is employed, a high selective etching ratio to the nitride-based compound semiconductor layer can be obtained when the metal layer is used as an etching mask. Further, the metal layer works as a light absorption layer, and when the metal layer is formed, light absorption to a higher mode can be increased, and the lateral mode can be stabilized.

Specifically, when the second electrode has a single-layered structure composed, for example, of a 0.05 μm thick Pd (palladium) layer, the adhesion of the second electrode to the second contacting layer can be particularly improved, and Pd attracts nitrogen atoms inside the second contacting layer to remove nitrogen vacancies in the second contacting layer immediately under the second electrode and, further, forms an hydrogen occlusion alloy, so that hydrogen is taken away from the second contacting layer containing, for example, a p-type impurity, whereby the p-type second contacting layer having a high carrier concentration can be obtained by activating the p-type impurity (p-type dopant). Further, when the second electrode has a single-layered structure composed, for example, of a 0.1 μm thick Pt (platinum) layer, the diffusion of tin (Sn) atoms in a solder into the second contacting layer can be particularly prevented when the solder is used for electrically connecting the second electrode to an outside electrode or circuit. Alternatively, the second electrode may have a single-layered structure composed of an alloy containing Ni (nickel) or gold (Au). Further, the second electrode may have a multi-layered structure such as a Pd/Pt, Pd/Ni, Pd/Au, Pt/Pd, Pt/Ni, Pt/Au, Ni/Pd, Ni/Pt or Ni/Au multi-layered structure. In the above multi-layered structure, a material before "/" constitutes a lower layer, a material after "/" constitutes an upper layer, and "/" in a multi-layered structure will be used in this sense hereinafter.

When the metal layer has a single-layered structure composed, for example, of a 0.1 μm thick Pt (platinum) layer, the diffusion of tin (Sn) atoms in a solder into the second contacting layer can be particularly prevented when the solder is used for electrically connecting the second electrode to an outside electrode or circuit. Further, when the metal layer has a single-layered structure composed, for example, of a 10 nm thick Ti (titanium) layer or a 0.1 μm thick Ni (nickel) layer, the adhesion of the metal layer to the insulating layer can be particularly improved. Further, the metal layer may have a multi-layered structure such as a Ti/Pt, Ti/Ru, Ti/Rh, Ti/Os, Ti/Ir, Ti/Ag, Ti/Ni, Ti/Pt, Ti/Pt/Ni, Ni/Pt, Ni/Ru, Ni/Rh, Ni/Os, Ni/Ir or Ni/Ag multi-layered structure.

The first electrode as an ohmic contact electrode to the first contacting layer desirably has a single-layered structure or a multi-layered structure containing at least one metal selected from the group consisting of gold (Au), Al (aluminum), Ti (titanium), tungsten (W), Cu (copper), Zn (zinc), tin (Sn) and indium (In). Examples thereof include Ti/Al and Ti/Pt/Au. When the first electrode has a multi-layered structure composed of Ti/Pt/Au, for example, a Ti layer is 5 to 10 nm thick, a Pt layer is $1\times10^{-7}$ m thick, and an Au layer is $2\times10^{-7}$ m to $3\times10^{-7}$ m thick.

The second pad electrode formed on the metal layer desirably has a single-layered structure or a multi-layered structure containing at least one metal selected from the group consisting of Ti (titanium), Pt (platinum) and Au (gold). When the second pad electrode has a single-layered structure composed, for example, of a 10 nm thick Ti (titanium) layer, the adhesion of the second pad electrode to the metal layer can be particularly improved. When the second pad electrode has a single-layered structure composed, for example, of a 0.1 μm thick Pt (platinum) layer, the diffusion of tin (Sn) atoms in a solder into the second contacting layer can be particularly prevented when the solder is used for electrically connecting the second electrode to an outside electrode or circuit. Further, when the metal layer has a single-layered structure composed, for example, of a 0.3 μm thick Au (gold) layer, an alloy with tin (Sn) atoms in a solder can be formed when the solder is used for electrically connecting the second electrode to an outside electrode or circuit. The second pad electrode may have a multi-layered structure such as a Ti/Pt/Au or Ti/Au multi-layered structure.

For a combination of the materials for constituting the second electrode, the metal layer and the second pad electrode, preferably, the second electrode has one structure of the following six cases;
 a single-layered structure of Pd,
 a single-layered structure of Pt,
 a single-layered structure of Ni,
 a multi-layered structure of Pd/Pt,
 a multi-layered structure of Pd/Ni, and
 a multi-layered structure of Pd/Au,
the metal layer has one structure of the following 25 cases;
 a multi-layered structure of Ti/Pt,
 a multi-layered structure of Ti/Ru,
 a multi-layered structure of Ti/Ru/Ni,
 a multi-layered structure of Ti/Rh,
 a multi-layered structure of Ti/Rh/Ni,
 a multi-layered structure of Ti/Os,
 a multi-layered structure of Ti/Os/Ni,
 a multi-layered structure of Ti/Ir,
 a multi-layered structure of Ti/Ir/Ni,
 a multi-layered structure of Ti/Ag,
 a multi-layered structure of Ti/Ag/Ni,
 a multi-layered structure of Ti/Ni,
 a multi-layered structure of Ti/Pt/Ni,
 a multi-layered structure of Ni/Pt,
 a multi-layered structure of Ni/Pt/Ni,
 a multi-layered structure of Ni/Ru,
 a multi-layered structure of Ni/Ru/Ni,
 a multi-layered structure of Ni/Rh,
 a multi-layered structure of Ni/Rh/Ni,
 a multi-layered structure of Ni/Os,
 a multi-layered structure of Ni/Os/Ni,
 a multi-layered structure of Ni/Ir,
 a multi-layered structure of Ni/Ir/Ni,
 a multi-layered structure of Ni/Ag, and
 a multi-layered structure of Ni/Ag/Ni, and
the second pad electrode has one structure of the following three cases;
 a single-layered structure of Au,
 a multi-layered structure of Ti/Au, and
 a multi-layered structure of Ti/Pt/Au.

That is, the number of combinations of the materials for constituting the second electrode, the metal layer and the second pad electrode is 450 cases (6×25×3=450). The combination of the materials may be any one of these cases. Of these combinations, a combination of materials of (Pd:Pt:Au) and a combination of (Pd/Pt:Ti/Pt/Ni:Ti/Pt/Au) are more preferred as a combination for constituting (second electrode:metal layer: second pad electrode).

In the nitride-based semiconductor laser device of the present invention or the method for the production thereof, desirably, the width of the ridge structure is at least 1.0 $\mu$m but not more than 2.0 $\mu$m, from the viewpoint of decreasing the power consumption of the nitride-based semiconductor laser device.

The first pad electrode formed on the first electrode desirably has a single-layered structure or a multi-layered structure containing at least one metal selected from the group consisting of Ti (titanium), Pt (platinum) and Au (gold).

In the present invention, the nitride-based compound semiconductor includes III–V group compound semiconductors containing a nitrogen element as a V group compound, such as GaN, an AlGaN mixed crystal, an AlInGaN mixed crystal, a BAlInGaN mixed crystal, an InGaN mixed crystal, InN and AlN. A nitride-based compound semiconductor layer can be deposited or formed, for example, by a metal organic chemical vapor deposition method (MOCVD method), a molecular beam epitaxy method (MBE method), or a hydride gas phase growth method in which a halogen contributes to transportation or a reaction. In the nitride-based semiconductor laser device of the present invention, or a nitride-based semiconductor laser device produced by the method for the production of a nitride-based semiconductor laser device, provided by the present invention, the nitride-based compound semiconductor is not specially limited in kind and composition, nor is the nitride-based compound semiconductor layer limited in structure and constitution, so long as the nitride-based semiconductor laser device has a stacked structure of the nitride-based compound semiconductor layers as a laser structure.

The substrate includes a sapphire substrate having a c-surface as a main surface, a GaN substrate and an SiC substrate.

In the present invention, the second contacting layer and the second cladding layer contain a p-type impurity, and the first electrode, the first contacting layer and the first cladding layer contain an n-type impurity. Alternatively, in the present invention, the second contacting layer and the second cladding layer contain an n-type impurity, and the first electrode, the first contacting layer and the first cladding layer contain a p-type impurity. The p-type impurity includes Mg, Zn, Cd, Be, Ca, Ba and O, and the n-type impurity includes Si, Ge, Se, Sn, C and Ti.

The plane form of the ridge structure includes the form of a stripe, the form of a taper and the form of a flare.

The nitride-based semiconductor laser device of the present invention has what can be called a shallow buried structure in which the insulating layer holds, from sides, the upper layer of the second cladding layer which upper layer forms the ridge structure. That is, the upper layer of the second cladding layer can have a large thickness, and the lower layer of the second cladding layer can have a small thickness. Further, the insulating layer is formed. Therefore, the nitride-based semiconductor laser device has a large current confinement effect and has excellent light output-current injection properties, and it has a sufficiently large effective refractive index difference $\Delta$n in a lateral direction, so that it has high controllability to a lateral mode and that it is highly stable in a lateral mode. Even if the upper layer of the second cladding layer is increased in thickness and even if the lower layer of the second cladding layer is decreased in thickness, an insulating layer having a sufficient thickness can be formed, so that there is no possibility of leak current flowing from the second pad electrode through the insulating layer and the lower layer of the second cladding layer.

In the method for the production of a nitride-based semiconductor laser device, provided by the present invention, the second-electrode is formed on the second cladding layer in a step that follows the step of depositing the second contacting layer, so that contamination of the top surface of the second contacting layer (contact surface to the second electrode) is suppressed, and that the deviation of the operation voltage from a desired value or a designed value can be prevented. Further, since the second electrode is formed on the second contacting layer before the formation of the insulating layer, no damage is caused on the top surface of the second contacting layer (contact surface to the second electrode) even if any method is employed to form the insulating layer. Further, the second contacting layer is etched by a self-alignment manner using the second electrode as an etching mask, and the second cladding layer is etched partly in its thickness direction to form the ridge structure, so that the second electrode can be formed on the second cladding layer such that the second electrode has substantially the same form and dimensions as those of the top surface of the second contacting layer (contact surface to the second electrode) and that no positional deviation (displacement) takes place between the second electrode and the second cladding layer unlike any conventional technique. Moreover, since the second electrode is used as an etching mask for forming the ridge structure, the steps of forming an etching mask for forming a ridge structure and removing the same are no longer required. Since the metal layer is used as an etching mask for forming the mesa structure, the steps of forming an etching mask for forming a mesa structure and removing the same are no longer required. Therefore, the number of the steps for the production process of the nitride-based semiconductor laser device is small as compared with any conventional production method, which can achieve an improvement in productivity.

BRIEF DESCRIPTION OF DRAWINGS.

FIG. 3B, are schematic partial cross-sectional views of the substrate, etc., for explaining the method for producing the nitride-based semiconductor laser device in Example 1.

FIG. 4B, are schematic partial cross-sectional views of the substrate, etc., for explaining the method for producing the nitride-based semiconductor laser device in Example 1.

FIG. 5B, are schematic partial cross-sectional views of the substrate, etc., for explaining the method for producing the nitride-based semiconductor laser device in Example 1.

FIG. 6B, are schematic partial cross-sectional views of the substrate, etc., for explaining the method for producing the nitride-based semiconductor laser device in Example 1.

FIG. 7B, is a schematic partial cross-sectional view of the substrate, etc., for explaining the method for producing the nitride-based semiconductor laser device in Example 1.

BEST MODE FOR CARRYING OUT THE INVENTION

The present invention will be explained hereinafter on the basis of Example and with reference to the drawings.

Example 1

Figure 1:
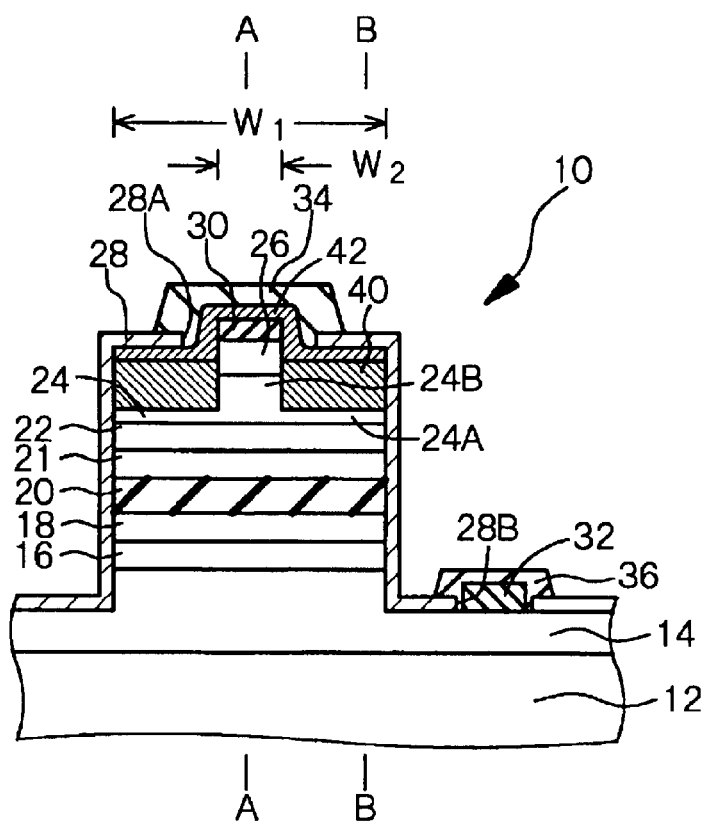
FIG. 1 is a schematic partial cross-sectional view of a nitride-based semiconductor laser device in Example 1.
Figure 2:
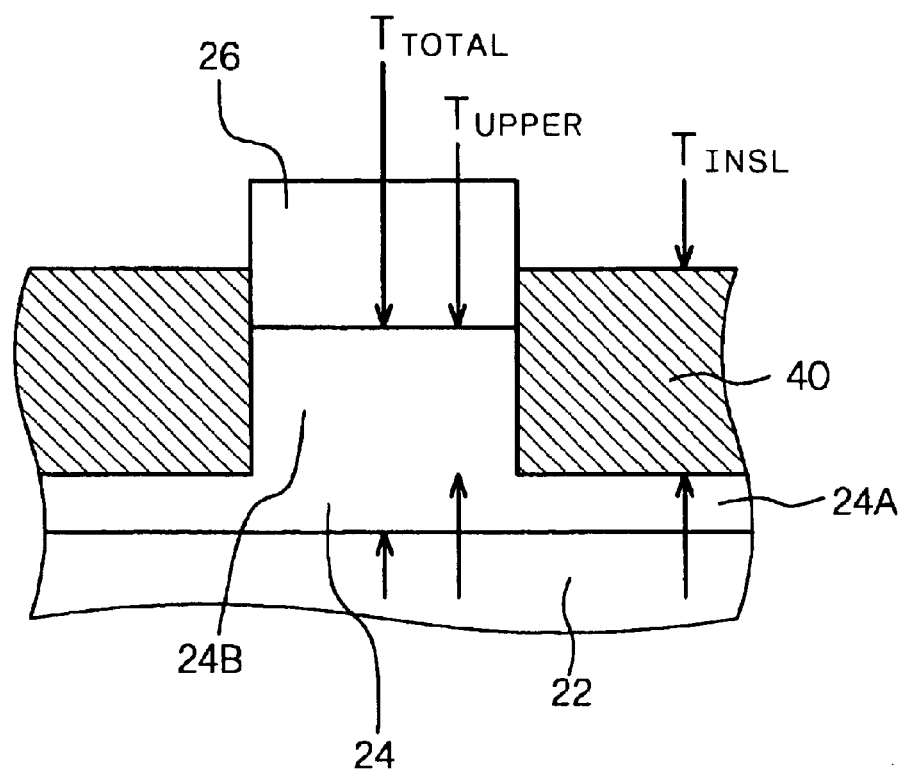
FIG. 2 is a schematic cross-sectional enlarged view of part of elements of the nitride-based semiconductor laser device in Example 1.
Figure 10:
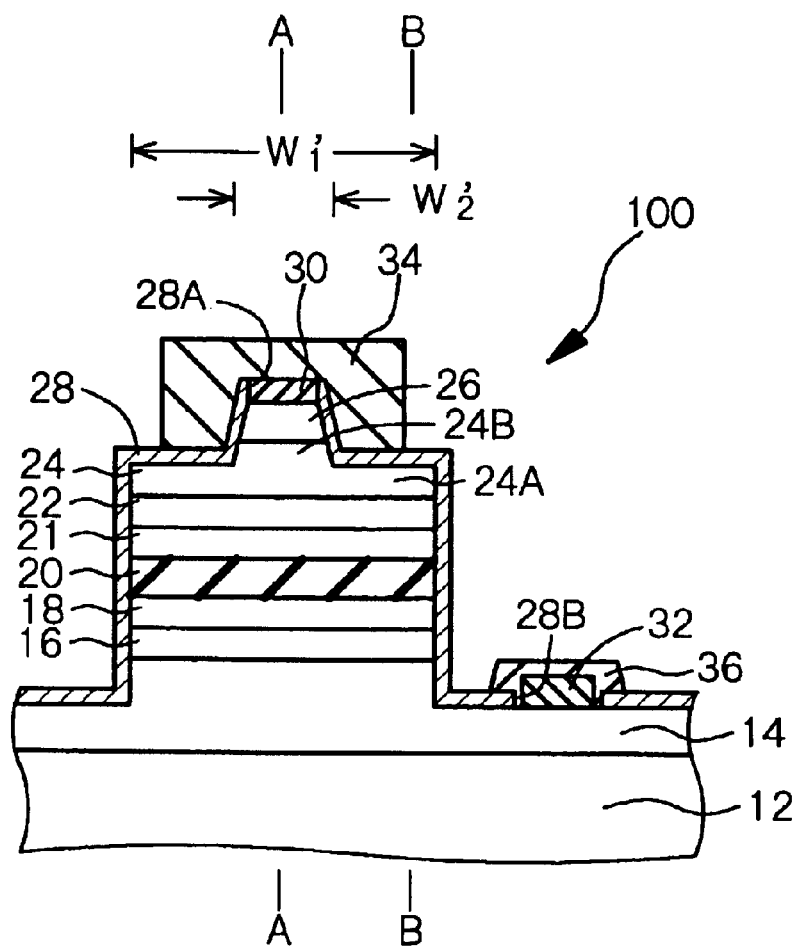
FIG. 10 is a schematic partial cross-sectional view of a conventional nitride-based semiconductor laser device.

FIG. 1 shows a schematic cross-sectional view of an index-guide type nitride-based semiconductor laser device (to be referred to as "semiconductor laser device 10", hereinafter) in Example 1. FIG. 2 shows a schematic cross-sectional enlarged view of part of elements of the semiconductor laser device 10. Of reference numerals showing elements of the semiconductor laser device 10 in Example 1, the same reference numerals as those in FIG. 10 show the same elements as those in FIG. 10.

As shown in FIG. 1, the semiconductor laser device 10 in Example 1 comprises;

(A) a first contacting layer 14 made of n-type GaN and formed on a substrate 12 made, for example, of a sapphire substrate having a c-surface as a main surface, (B) a first electrode 32 formed on the first contacting layer 14, (C) a first cladding layer 16 made of n-type AlGaN and formed on the first contacting layer 14, (D) an active layer 20 having a multiple quantum well structure of GaN/InGaN formed on the first cladding layer 16, (E) a second cladding layer 24 made of p-type AlGaN and formed on the active layer 20, (F) a second contacting layer 26 made of p-type GaN and formed on the second cladding layer 24, and (G) a second electrode 30 formed on the second contacting layer 26.

A first light-guiding layer 18 made of n-type InGaN is formed between the first cladding layer 16 and the active layer 20, and a degradation-preventing layer 21 made of AlGaN for preventing the degradation of the active layer 20 and a second light-guiding layer 22 made of p-type InGaN are formed between the active layer 20 and the second cladding layer 24. These layers are provided as required.

Further, since a threading dislocation extending along a c-axis may occur upwardly from the substrate surface of the substrate 12 made of the sapphire substrate, preferably, the threading dislocation density is decreased as follows. A buffer layer made of a low-temperature growth GaN is formed on the substrate 12, a substratum layer made of GaN is formed on the buffer layer by lateral growth according to a laterally epitaxial growth method such as an ELO (Epitaxial Lateral Overgrowth) method, and the first contacting layer 14 is grown. These layers are provided as required. The drawings omit showing of the buffer layer and the substratum layer.

The second cladding layer 24 comprises a lower layer (lower layer 24A of the second cladding layer 24) and an upper layer (upper layer 24B of the second cladding layer 24).

The first cladding layer 16, the first light-guiding layer 18, the active layer 20, the degradation-preventing layer 21, the second light-guiding layer 22 and the second cladding layer 24 are composed of a nitride-based compound semiconductor layer each as described above. Further, the first cladding layer 16, the first light-guiding layer 18, the active layer 20, the degradation-preventing layer 21, the second light-guiding layer 22 and the lower layer 24A of the second cladding layer have a mesa structure. That is, in Example 1, these layers have the form of a stripe and have substantially the same width $W_1$. The upper layer 24B of the second cladding layer and the second contacting layer 26 have a ridge structure having a width narrower than the width $W_1$ of the mesa structure. That is, in Example 1, the above layers have the form of a stripe and have substantially the same width $W_2$ ($W_1 > W_2$). The ridge structure extends in the same direction as the direction in which the mesa structure extends. Side surfaces of the upper layer 24B of the second cladding layer and the second contacting layer 26 are nearly perpendicular to the substrate 12. And, the second electrode 30 and the second contacting layer 26 have substantially the same widths in the interface between the second contacting layer 26 and the second electrode 30.

An insulating layer 40 is formed on the portions of the lower layer 24A of the second cladding layer 24 which portions correspond to the top surface of the mesa structure, such that the insulating layer 40 covers at least part of each side surface of the upper layer 24B of the second cladding layer 24 (more specifically, in the semiconductor laser device 10 in Example 1, the insulating layer 40 covers each side surface of the upper layer 24B of the second cladding layer 24 and a lower portion of each side surface of the second contacting layer 26). The insulating layer 40 is made of $SiO_2$. Portions of the insulating layer 40 formed on the portions of the lower layer 24A of the second cladding layer 24 which portions correspond to the top surface of the mesa structure (more specifically, the insulating layer 40 formed on the portions of the lower layer 24A of the second cladding layer 24 which portions are other than vicinities of both side surfaces of the upper layer 24B of the second cladding layer 24 and on which portions no the upper layer 24B of the second cladding layer 24 is formed) have a thickness $T_{INSL}$ of 0.2 μm (see FIG. 2). The insulating layer 40 is formed on the portions of the lower layer 24A of the second cladding layer 24 which portions correspond to the top surface of the mesa structure, such that the insulating layer 40 holds, from sides, the upper layer 24B of the second cladding layer 24 to form a shallow buried structure, namely, such that the upper layer of the second cladding layer is increased in thickness and that the lower layer of the second cladding layer is decreased in thickness. The second cladding layer 24 has a total thickness $T_{TOTAL}$ (see FIG. 2) of 0.65 μm, and the upper layer 24B of the second cladding layer 24 has a thickness $T_{UPPER}$ (see FIG. 2) of 0.15 μm.

On the second contacting layer 26 is formed the second electrode 30 that constitutes an ohmic contact electrode to the second contacting layer 26. The second electrode 30 has a multi-layered structure composed of Pd/Pt (Pd forming a lower layer and Pt forming an upper layer) which structure has substantially the same form and dimensions as those of the top surface of the second contacting layer 26. The drawings show one layer as the second electrode 30.

Further, a metal layer 42 having substantially the same width as the width ($W_1$) of the mesa structure is formed on the top surface of the insulating layer 40 and the top surface of the second electrode 30 such that the metal layer 42 continues from one top surface to the other. The metal layer 42 has a multi-layered structure composed of Ti/Pt/Ni (Ti having a thickness of 10 nm, Pt having a thickness of 0.1 μm, Ni having a thickness of 0.1 μm, Pt constituting a lowermost layer, and Ni constituting an uppermost layer), and the metal layer 42 is electrically connected to the second electrode 30. The drawings show one layer as the metal layer 42.

Further, a protection layer 28 made of $SiO_2$ is formed on the surface of the first contacting layer 14, the side surfaces of the mesa structure and the top surfaces of the metal layer 42 such that the protection layer continues from the surface of the first contacting layer 14 to the top surface of the metal layer 42 through the side surfaces of the mesa structure. More specifically, the protection layer 28 is formed on the surface of the first contacting layer 14, the side surfaces of the first cladding layer 16, the side surfaces of the first light-guiding layer 18, the side surfaces of the active layer 20, the side surfaces of the degradation-preventing layer 21, the side surfaces of the second light-guiding layer 22, the side surfaces of the lower layer 24A of the second cladding layer 24, the side surfaces of the insulating layer 40, the side surfaces of the metal layer 42 and the top surfaces of the metal layer 42. A first opening portion 28B is formed in a portion of the protection layer 28 formed on the surface of the first contacting layer 14, and the first electrode 32 having a multi-layered structure composed of Ti/Pt/Au (Ti constituting a lower layer, and Au constituting an upper layer) is formed on the first contacting layer 14 exposed in the bottom of the first opening portion 28B, as an ohmic contact electrode to the first contacting layer 14. The Ti layer, the Pt layer and the Au layer forming the first electrode 32 have a thickness, for example, of 10 nm, 0.1 μm and 0.3 μm, respectively. Further, a first pad electrode 36 made of Ti/Pt/Au and electrically connected to the first electrode 32 is formed on the first electrode 32 as a leading electrode. A second opening portion 28A is formed in a portion of the protection layer 28 on the metal layer 42 on the second electrode 30, and a second pad electrode 34 (having a multi-layered structure composed of Ti/Pt/Au layers, the Ti layer being a lowermost layer, the Au layer being an uppermost layer) is formed on an exposed portion of the metal layer 42 as a leading electrode. The drawings show each of the first pad electrode 36 and the second pad electrode 34 as one layer.

The method for the production of the semiconductor laser device 10 in Example 1 will be explained with reference to FIGS. 3A and 3B, FIGS. 4A and 4B, FIGS. 5A and 5B, FIG. 6A and 6B, FIGS. 7A and 7B and FIG. 8 which are schematic partial cross-sectional views of the substrate and the like.

[Step-100]

Figure 3A:
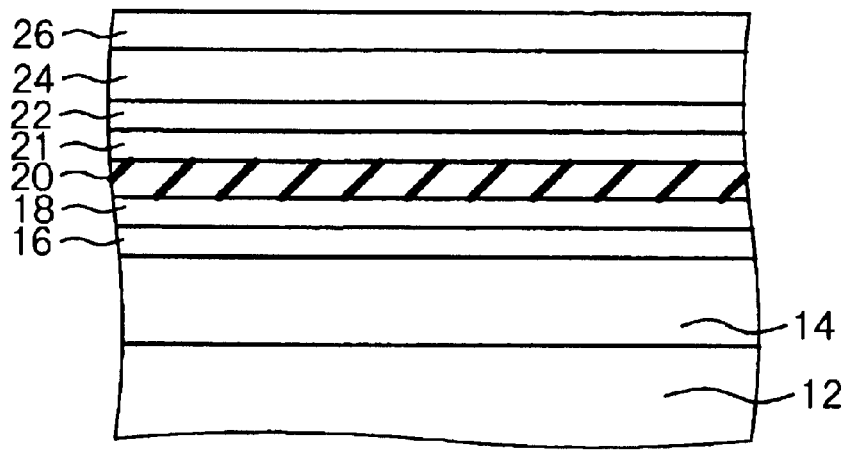
FIGS. 3A and 3B are schematic partial cross-sectional views of a substrate, etc., for explaining a method for producing the nitride-based semiconductor laser device in Example 1.
Figure 3B:
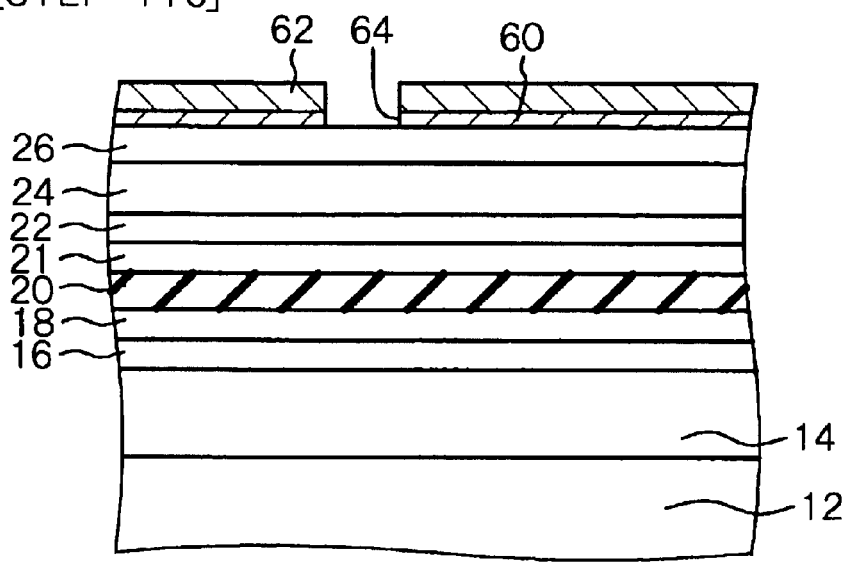

First, the first contacting layer 14, the first cladding layer 16, the active layer 20, the second cladding layer 24 and the second contacting layer 26 are consecutively deposited on the substrate 12. Specifically, the following stacked structure is formed on the substrate 12 made of a sapphire substrate having a c-surface as a main surface by an MOCVD method or the like. As shown in FIG. 3A, the stacked structure is formed by consecutively forming (depositing) the first contacting layer 14 made of n-type GaN, the first cladding layer 16 made of n-type AlGaN, the first light-guiding layer 18 made of n-type InGaN, the active layer 20 having a GaN/InGaN multiple quantum well structure, the degradation-preventing layer 21 made of AlGaN for preventing the degradation of the active layer 20, the second light-guiding layer 22 made of p-type InGaN, the second cladding layer 24 made of p-type AlGaN and the second contacting layer 26 made of p-type GaN. A buffer layer (not shown) made of low-temperature growth GaN may be formed on the substrate 12 first, and then a substratum layer (not shown) made of GaN may be grown on the buffer layer by lateral growth before the first contacting layer 14 is grown.

Various nitride-based compound semiconductor layers other than the buffer layer and the active layer 20 can be deposited at a temperature of approximately 1000° C., the active layer can be deposited at a temperature of 700 to 800° C. for preventing the decomposition of In, and the buffer layer can be deposited at a temperature of approximately 560° C. In the formation of each nitride-based compound semiconductor layer by an MOCVD method, trimethylgallium (TMG) gas can be used as a Ga source, and ammonia gas can be used as an N source. Further, in the formation of the n-type nitride-based compound semiconductor layers, for example, silicon (Si) can be added as an n-type impurity. In the formation of the p-type nitride-based compound semiconductor layers, for example, magnesium (Mg) can be added as a p-type impurity. Further, trimethylaluminum (TMA) gas can be used as an Al source, trimethylindium (TMI) gas can be used as an In source, monosilane gas ($SiH_4$ gas) can be used as an Si source, and cyclopentadienylmagnesium gas can be used as an Mg source.

[Step-110]

Then, the second electrode 30 having substantially the same width as the second contacting layer 26 to be formed (that is, having the form of a stripe substantially having a width $W_2$ in Example 1) is formed on the second contacting layer 26.

Specifically, a 0.2 μm thick mask layer 60 made of $SiO_2$ is formed on the second contacting layer 26. Then, a photoresist layer 62 is formed on the mask layer 60, and an opening having the form of a stripe having a width of approximately $W_2$ is formed in the photoresist layer 62 by photolithography. Then, while using the photoresist layer 62 as an etching mask, the mask layer 60 is etched by a wet etching method using a hydrofluoric-acid-containing etching solution, whereby an opening 64 can be obtained in which the top surface of the second contacting layer 26 is exposed (see FIG. 3B). Then, a 50 nm thick Pd layer and a 0.1 μm thick Pt layer are consecutively formed by a vacuum deposition method to form a multi-layered metal film 30A on the photoresist layer 62 and the second contacting layer 26 positioned in a bottom of the opening 64. The drawings show one layer as the multi-layered metal film 30A. Then, the photoresist layer 62 is removed by an ashing method, and, further, the mask layer 60 is removed by a wet etching method using hydrofluoric acid. By the above procedures, the multi-layered metal film 30A on the photoresist layer 62 is removed, and, the multi-layered metal film 30A is left only on the portion of the second contacting layer 26 which portion is positioned in the bottom of the opening 64 (see FIG. 4A). The multi-layered metal film 30A having the form of a stripe having a width of approximately $W_2$ corresponds to the second electrode 30. The second contacting layer 26 in a region other than the region where the second electrode 30 is formed is brought into a state where the top surface thereof is exposed. In a step that follows the deposition of the second contacting layer 26, the second electrode 30 is immediately formed, so that the contamination of the top surface of the second contacting layer 26 which top surface is a contact surface to the second electrode 30 can be effectively prevented.

[Step-120]

Then, while using the second electrode 30 as an etching mask, the second contacting layer 26 is etched, and, further, the second cladding layer 24 is partly etched in its thickness direction, to form the second contacting layer 26 and the upper layer 24B of the second cladding layer 24 having the form of a strip substantially having a width of $W_2$, and also to form the lower layer 24B of the second cladding layer 24 having top portions exposed on both sides of the upper layer 24B of the second cladding layer 24.

Figure 4A:
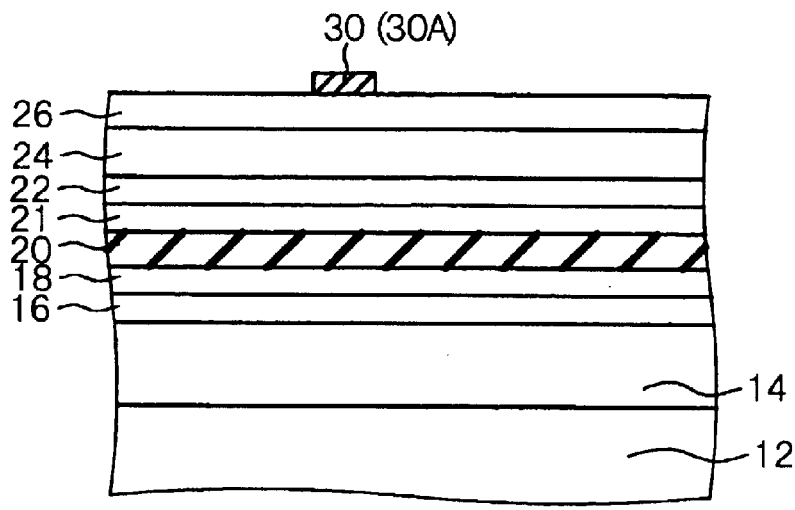
FIGS. 4A and 4B, following
Figure 4B:
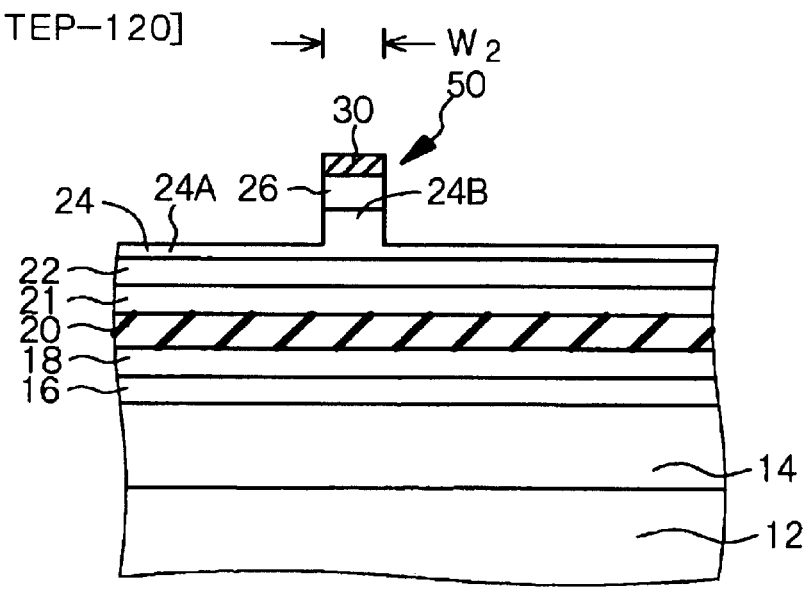
Figure 5A:
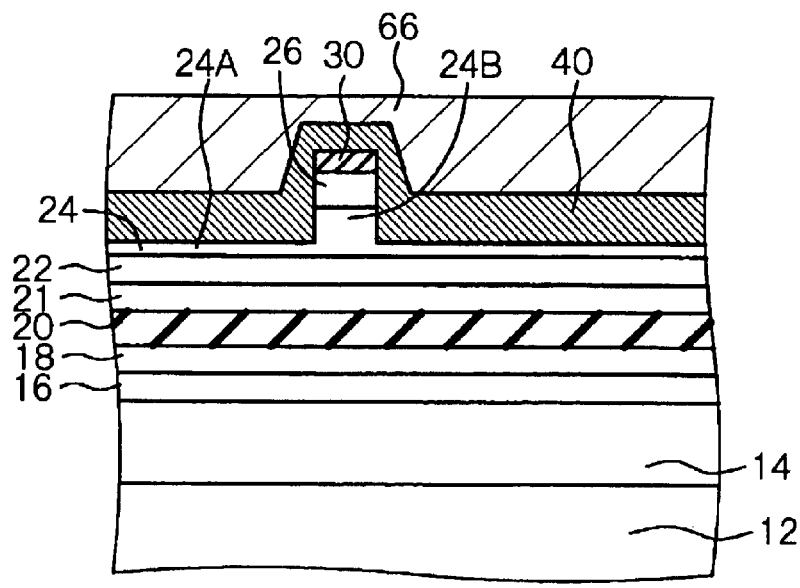
FIGS. 5A and 5B, following
Figure 5B:
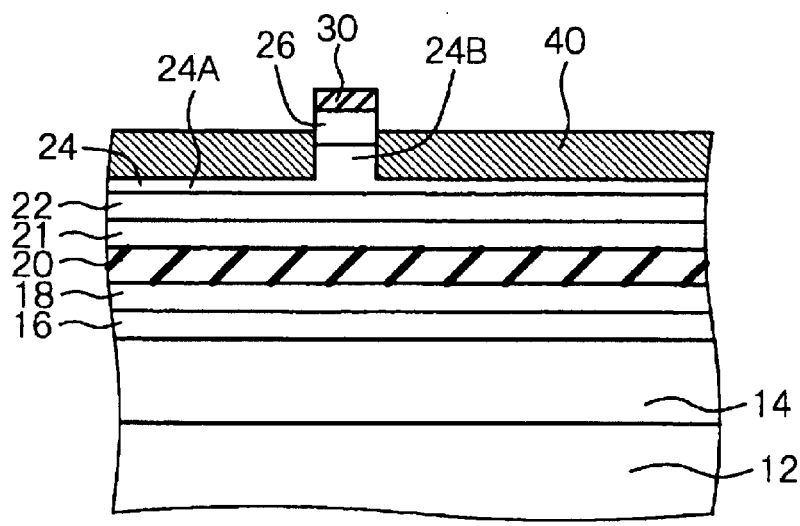
Figure 6A:
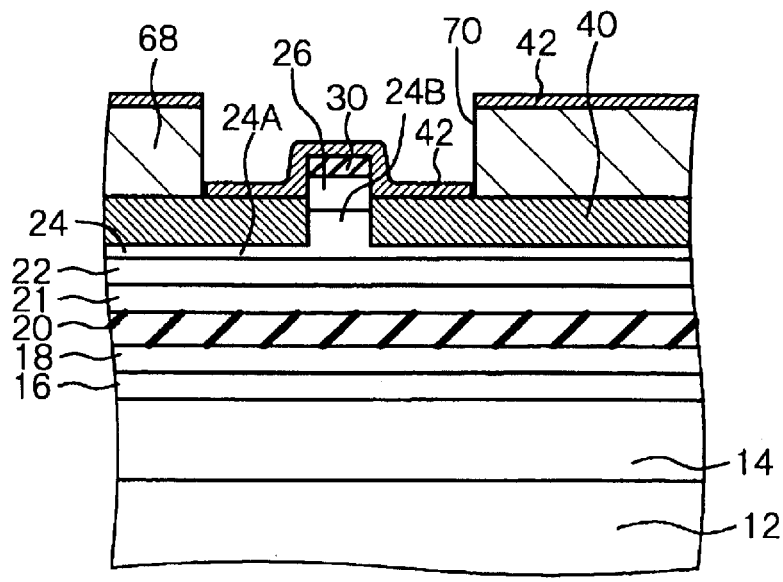
FIGS. 6A and 6B, following
Figure 6B:
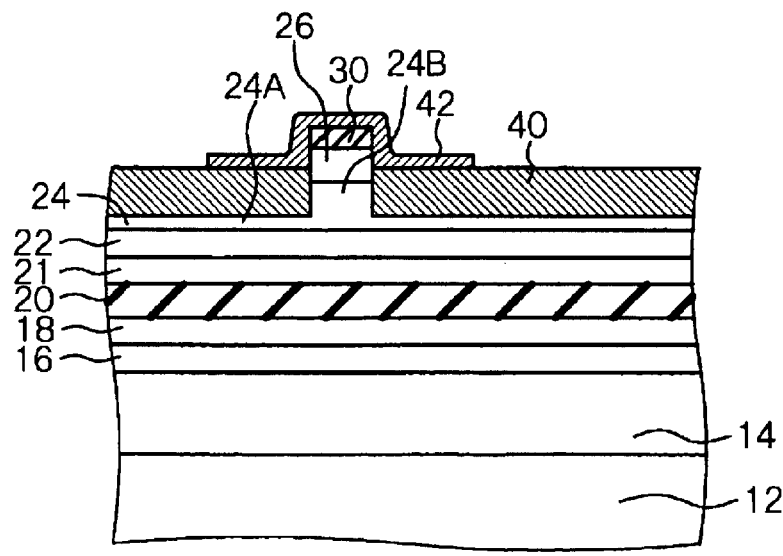

Specifically, while using the second electrode 30 as a mask, the second contacting layer 26 and an upper layer portion of the second cladding layer 24 are etched by a dry etching method using a chlorine-containing etching gas, to form the ridge structure 50 shaped in the form of a stripe and constituted of the second contacting layer 26 and the upper layer 24B of the second cladding layer 24 (see FIG. 4B). The second electrode 30, the second contacting layer 26 and the upper layer 24B of the second cladding layer 24 have the form of a stripe substantially having a width of $W_2$. Since the ridge structure is formed by a self-alignment manner using the second electrode 30 as an etching mask, the second electrode 30 can be formed on the second contacting layer 26 such that the second electrode 30 has substantially the same form and dimensions as those of the top surface of the second contacting layer 26 (contact surface to the second electrode 30), and no positional deviation (displacement) takes place between the second electrode 30 and the second contacting layer 26. Further, the ridge structure is formed while using the second electrode 30 as an etching mask, that is, by a self-alignment manner, so that the steps of forming an etching mask necessary for forming a ridge structure and removing the etching mask can be omitted unlike any conventional technique.

[Step-130]

Then, the insulating layer 40 is formed on the portions of the lower layer 24A of the second cladding layer 24 on which portions no upper layer 24B of the second cladding layer 24 is formed, such that the insulating layer 40 covers at least part of both side surfaces of the upper layer of the second cladding layer (more specifically, each of both side surfaces of the upper layer 24B of the second cladding layer and a lower portion of each of both side surfaces of the second contacting layer 26 in Example 1). Since the second electrode 30 is formed on the second contacting layer 26 before the formation of the insulating layer 40, the formation of the insulating layer causes no damage in the contact surface between the second contacting layer and the second electrode.

Specifically, first, a 0.2 $\mu$m thick insulating layer 40 made of $SiO_2$ is formed on the entire surface. Then, a photoresist film 66 is formed (applied) on the insulating layer 40 such that it has a small thickness above the second electrode 30 and a large thickness above the lower layer 24A of the second cladding layer 24 where the upper layer 24B of the second cladding layer 24 is not formed (see FIG. 5A). The top surface of the photoresist film 66 is nearly at the same level above the second electrode 30 and above the lower layer 24A of the second cladding layer 24 where the upper layer 24B of the second cladding layer 24 is not formed. Then, while using the second electrode 30 as an etching-stop layer, the photoresist film 66 and the insulating layer 40 at least on the second electrode 30 are etched (more specifically, the photoresist film 66 and the insulating layer 40 are etched back) to expose at least the top surface of the second electrode 30 (more specifically, the top surface and the side surfaces of the second electrode 30 and an upper portion of each of both side surfaces of the second contacting layer 26) (see FIG. 5B). That is, the height difference of the ridge structure 50 is utilized, the second electrode 30 is used as an etching-stop layer, and the top surface of the second electrode 30 is exposed. The insulating layer 40 is left in a state where it covers both side surfaces of the upper layer 24B of the second cladding layer and covers lower portions of both side surfaces of the second contacting layer 26.

[Step-140]

Then, the metal layer 42 having substantially the same width as the width ($W_1$) of the mesa structure to be formed is formed on the top surface of the insulating layer 40 and the top surface of the second electrode such that the metal layer 42 continues from one top surface to the other. Specifically, the metal layer 42 having the form of a stripe and substantially having a width $W_1$ ($>W_2$) is formed.

That is, a photoresist layer 68 is formed (applied) on the entire surface, and an opening 70 having the form of a stripe and substantially having a width of $W_1$ is formed through the photoresist layer 68. There is produced a state where the second electrode 30 and part of the insulating layer 40 are exposed in the bottom of the opening 70. Then, the metal layer 42 having a multi-layered structure composed of Ti/Pt/Ni is formed on the entire surface by a sputtering method (see FIG. 6A). That is, a 10 nm thick Ti layer, a 0.1 $\mu$m thick Pt layer and a 0.1 $\mu$m thick Ni layer are consecutively deposited by a sputtering method. The drawings show one layer as the metal layer 42. Then, the photoresist layer 68 is removed by an ashing method, to remove a portion of the metal layer 42 on the photoresist layer 68, and the metal layer 42 is retained on the second electrode 30 and the insulating layer 40 which are positioned in the bottom of the opening 70 (see FIG. 6B).

[Step-150]

Figure 7A:
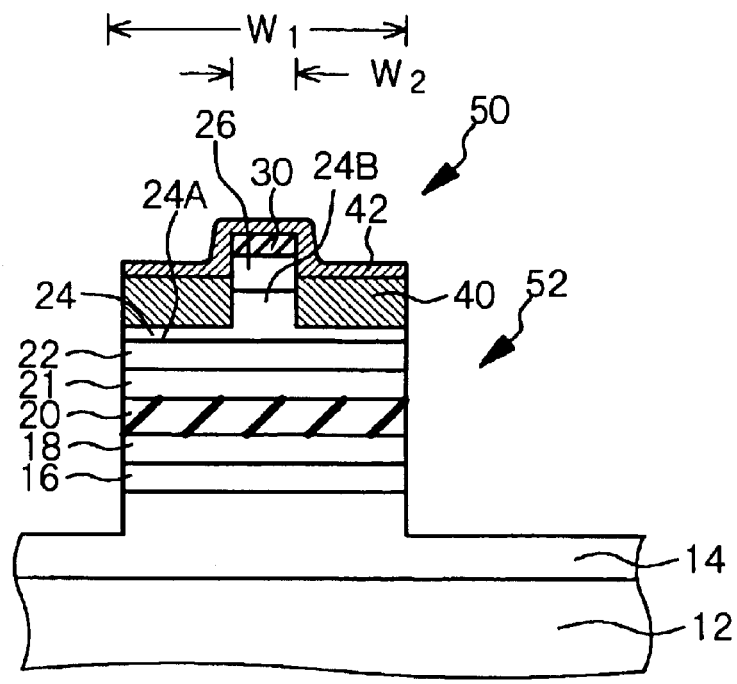
FIGS. 7A and 7B, following
Figure 7B:
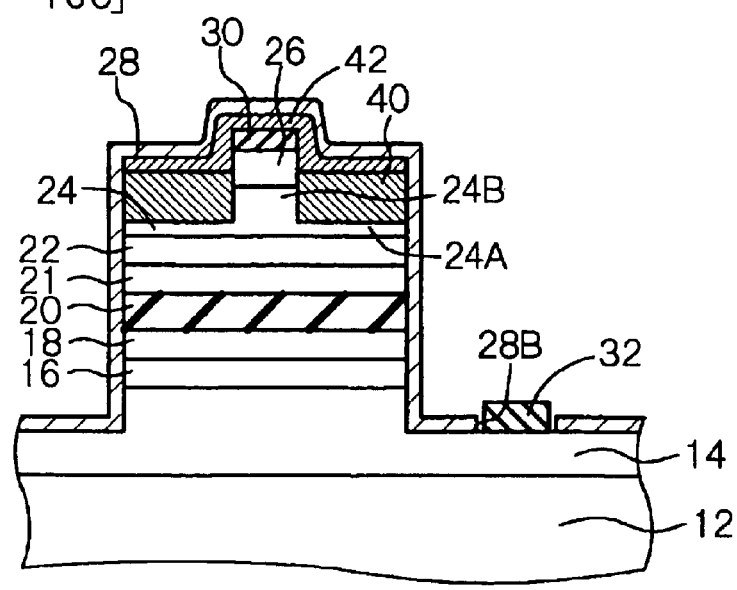
Figure 8:
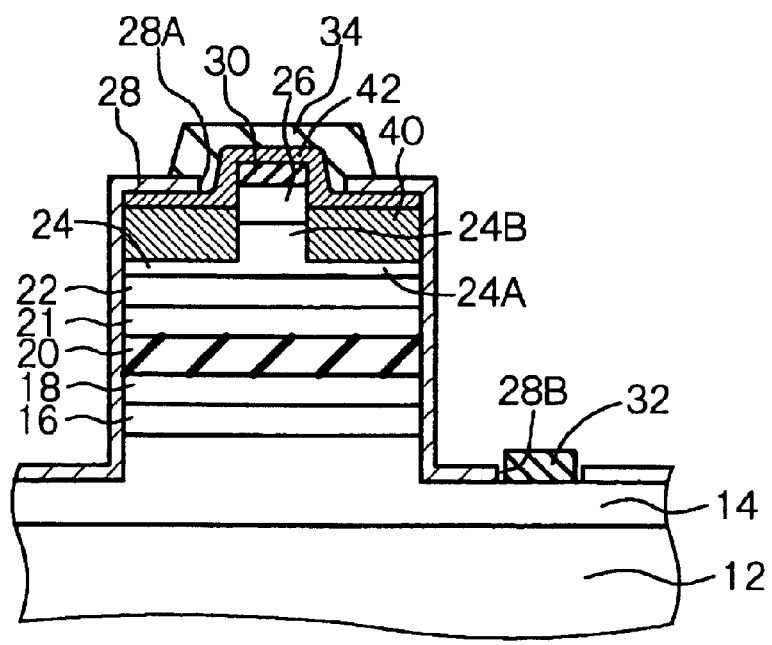
FIG. 8, following

Then, while using the metal layer 42 as an etching mask, the insulating layer 40, the lower layer 24A of the second cladding layer 24, the second light-guiding layer 22, the degradation-preventing layer 21, the active layer 20, the first light-guiding layer 18, the first cladding layer 16 and part of the first contacting layer 14 are etched, whereby a mesa structure 52 as shown in FIG. 7A can be obtained. Since the metal layer 42 is used as an etching mask during the formation of the mesa structure, the steps of forming an etching mask for forming a mesa structure and removing the etching mask are no longer required.

[Step-160]

Then, a 0.3 $\mu$m thick protection layer 28 made of $SiO_2$ is formed on the entire surface, specifically, on the surface of the first contacting layer 14, the side surfaces of the mesa structure and the top surface of the metal layer 42 such that the protection layer 28 continues from the surface of the first contacting layer 14 to the top surface of the metal layer 42 through the side surfaces of the mesa structure. More specifically, the protection layer 28 is formed on the surface of the first contacting layer 14, the side surfaces of the first cladding layer 16, the side surfaces of the first light-guiding layer 18, the side surfaces of the active layer 20, the side surfaces of the degradation-preventing layer 21, the side surfaces of the second light-guiding layer 22, the side surfaces of lower layer 24A of the second cladding layer 24, the side surfaces of the insulating layer 40, the side surfaces of the metal layer 42 and the top surface of the metal layer 42. Then, the first opening portion 28B is formed in a portion of the protection layer 28 formed on the surface of the first contacting layer 14, and the first electrode 32 is formed on the exposed first contacting layer 14 (see FIG. 7B). Further, the second opening portion 28A is formed in a portion of the protection layer 28 formed on the metal layer 42 on the second electrode 30 (more specifically, a portion of the protection layer 28 that is formed on a portion of the metal layer 42 on the insulating layer 40 and a portion of the metal layer 42 on the second electrode 30 such that the protection layer 28 continues from the portion of the metal layer 42 on insulating layer 40 to the portion of the metal layer 42 on the second electrode 30). Then, the second pad electrode 34 is formed on the exposed portion of the metal layer 42 (see FIG. 8). The second pad electrode 34 has a multi-layered structure composed of a 10 nm thick Ti layer/a 0.1 μm thick Pt layer/a 0.3 μm thick Au layer such that the Ti layer, the Pt layer and the Au layer are stacked in this order from the bottom. Then, the first pad electrode 36 is formed on the first electrode 32. The first pad electrode 36 is composed of a 10 nm thick Ti layer/a 0.1 μm thick Pt layer/a 0.3 μm thick Au layer. In the above manner, the semiconductor laser device 10 shown in FIG. 1 can be produced. Then, cleavage, palletizing, die-bonding or wire-bonding and cap-sealing are carried out to complete the semiconductor laser device 10.

While the present invention has been explained with reference to preferred embodiment hereinabove, the present invention shall not be limited thereto. The substrate and the kinds, compositions, thickness, constitutions, structures and the like of the nitride-based compound semiconductor layers explained in Example are given as examples and may be modified and altered as required. Conditions and various numerical values explained in Example and materials used in Example are given as examples and may be modified and altered as required. The method of deposition (formation) of those layers made of nitride-based compound semiconductors shall not be limited to the MOCVD method, and the deposition (formation) may be carried out by an MBE method, a hydride gaseous phase growth method in which a halogen contributes to transportation or a reaction, or some other method. Further, the sapphire substrate used as a substrate may be replaced with a GaN substrate or an SiC substrate.

Figure 9A:
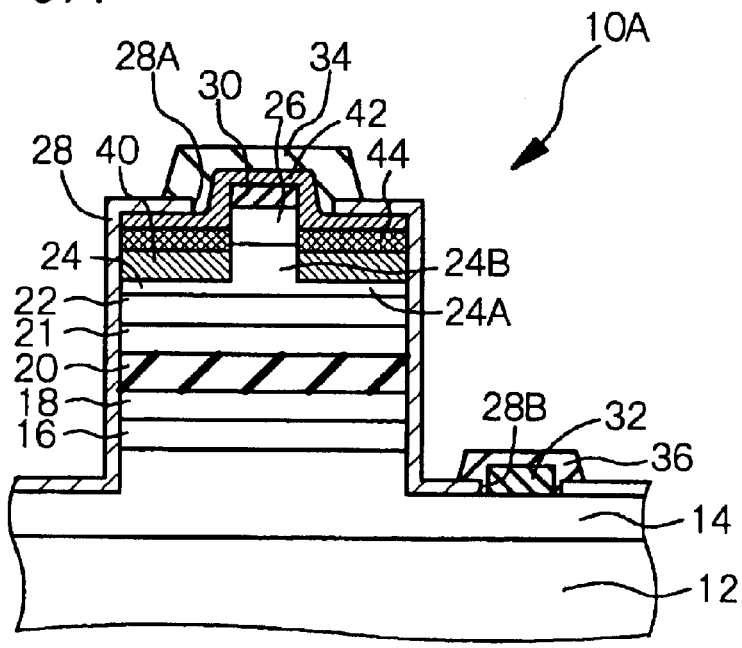
FIGS. 9A and 9B are schematic partial cross-sectional views of variants of the nitride-based semiconductor laser device in Example 1.
Figure 9B:
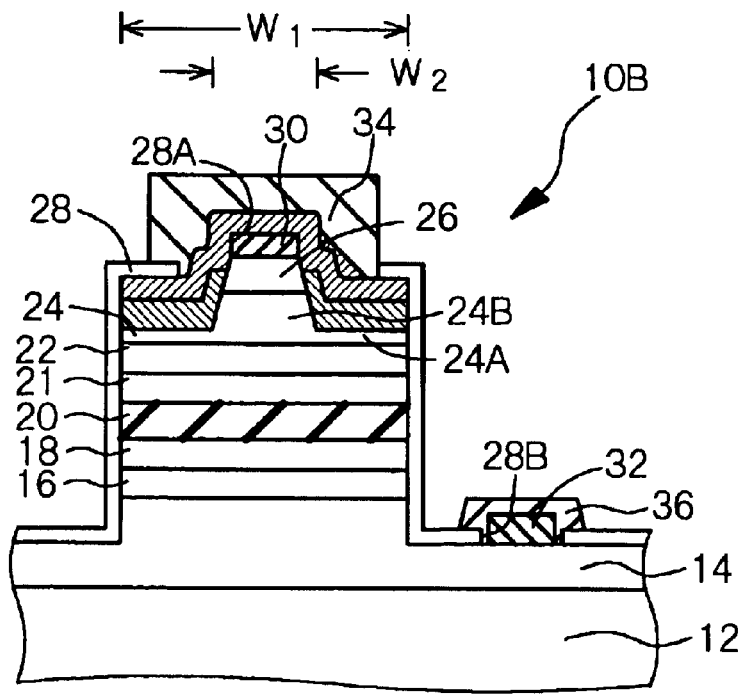

FIGS. 9A and 9B show schematic cross-sectional views of variants of the semiconductor laser device in Example 1. of reference numerals showing elements of the semiconductor laser devices 10A and 10B shown in FIGS. 9A and 9B, the same reference numerals as those in FIG. 1 show the same elements as those in FIG. 1. In the semiconductor laser device 10A shown in FIG. 9A, a silicon layer (specifically, for example, an amorphous silicon layer 44) is formed on the insulating layer 40 (that is, between the insulating layer 40 and the metal layer 42), for example, by a vacuum deposition method or some other method. The amorphous silicon layer 44 works as a light-absorbing layer, and the amorphous silicon layer 44 can serve to increase the effective refractive index difference Δn in a lateral direction. In the semiconductor laser device 10B shown in FIG. 9B, the ridge structure has downward sloping side surfaces. In this case, the width ($W_2$) of the ridge structure corresponds to the largest width of the ridge structure. That is, the width ($W_2$) of the ridge structure corresponds to the width of the upper layer 24B of the second cladding layer 24 in the interface between the upper layer 24B and the lower layer 24A of the second cladding layer 24.

In the nitride-based semiconductor laser device of the present invention, the insulating layer is formed on the lower layer of the second cladding layer constituting the mesa structure such that the insulating layer holds the upper layer of the second cladding layer from sides, that is, a shallow buried structure is formed, so that a high current confinement effect is obtained and that the nitride-based semiconductor laser device has excellent light output-current injection characteristics. Further, the effective refractive index difference Δn in a lateral direction [difference ($\Delta n=n_{EFF1}-n_{EFF2}$) between an effective refractive index $n_{EFF1}$ obtained by measurement along the line A—A in FIG. 1 and an effective refractive index $n_{EFF2}$ obtained by measurement along the line B—B in FIG. 1] can be increased. As a result, the controllability to the lateral mode is enhanced, and excellent lateral mode stability can be accomplished. Further, the second electrode free of positional deviation (displacement) from the second contacting layer is provided, so that there is caused no increase in the operation voltage.

According to the method for the production of a nitride-based semiconductor laser device, provided by the present invention, the second electrode is formed on the second contacting layer immediately after the formation of the second contacting layer, so that there can be reliably avoided the problem of a conventional production method that the operation voltage increases since the top surface of the second contacting layer (contact surface to the second electrode) is contaminated and therefore comes to have a large electric resistance. Further, the ridge structure is formed while using the second electrode as an etching mask, that is, the ridge structure can be formed by a self-alignment manner, there is caused no positional deviation (displacement) between the second electrode and the second contacting layer. Therefore, the operation voltage does not deviate from a desired value or designed value unlike a conventional case. Further, the second electrode is used as an etching mask for forming the ridge structure, so that the steps of forming an etching mask for forming a ridge structure and removing the etching mask can be omitted. The metal layer is used as an etching mask for forming the mesa structure, so that the steps of forming an etching mask for forming a mesa structure and removing the etching mask can be omitted. Therefore, the number of process steps of production of a nitride-based semiconductor laser device is smaller than the counterpart in a conventional production method, which brings an improvement in productivity.

What is claimed is:

1. A method for the production of a nitride-based semiconductor laser device having:

(A) a first contacting layer formed on a substrate, (B) a first electrode formed on the first contacting layer, (C) a first cladding layer formed on the first contacting layer, (D) an active layer formed on the first cladding layer, (E) a second cladding layer formed on the active layer, (F) a second contacting layer formed on the second cladding layer, and (G) a second electrode formed on the second contacting layer, the second cladding layer comprising a lower layer and an upper layer, the first contacting layer, the first cladding layer, the active layer, the second cladding layer and the second contacting layer each being composed of a nitride-based compound semiconductor layer, the first cladding layer, the active layer and the lower layer of the second cladding layer forming a mesa structure, the upper layer of the second cladding layer and the second contacting layer having a ridge structure having a width smaller than a width of the mesa structure, the second electrode having a width substantially the same as a width of the second contacting layer at an interface of the second contacting layer and the second electrode, an insulating layer formed on the portions of the lower layer of the second cladding layer which portions correspond to a top surface of the mesa structure, said insulating layer covering at least part of each of both side surfaces of the upper layer of the second cladding layer, and a metal layer being formed on a top surface of the insulating layer and a top surface of the second electrode such that the metal layer continues from the top surface of the insulating layer to the top surface of the second electrode, said metal layer having a width substantially the same as the width of the mesa structure, said method comprising the steps of:
(a) consecutively depositing the first contacting layer, the first cladding layer, the active layer, the second cladding layer and the second contacting layer on the substrate, and then forming the second electrode having substantially the same width as the second contacting layer on the second contacting layer;
(b) while using the second electrode as an etching mask, etching the second contacting layer and further partly etching the second cladding layer in the second cladding layer thickness direction, to form the second contacting layer and the upper layer of the second cladding layer having the ridge structure and to form the lower layer of the second cladding layer having top surfaces of which are exposed on both sides of the upper layer of the second cladding layer;
(c) forming the insulating layer on the portions of the lower layer of the second cladding layer on which portions no upper layer of the second cladding layer is formed, so as to cover at least part of each of both side surfaces of the upper layer of the second cladding layer and to expose the top surface of the second electrode;
(d) forming the metal layer having substantially the same width as the width of the mesa structure to be formed, on the insulating layer and the top surface of the second electrode such that the metal layer continues from the surface of the insulating layer to the top surface of the second electrode; and
(e) while using the metal layer as an etching mask, etching at least the insulating layer, the lower layer of the second cladding layer, the active layer and the first cladding layer, to form the mesa structure.

2. A The method for the production of a nitride-based semiconductor laser device according to claim 1, in which after the step (e), forming a protection layer on the a surface of the first contacting layer, side surfaces of the mesa structure and a top surface of the metal layer, such that the protection layer continues from the surface of the first contacting layer through the side surfaces of the mesa structure to the top surface of the metal layer, and then, forming a first opening portion in a portion of the protection layer formed on the surface of the first contacting layer, forming a first electrode on the exposed first contacting layer, forming a first pad electrode on the first electrode, forming a second opening portion in the protection layer on the metal layer on the second electrode, and forming a second pad electrode on the exposed portion of the metal layer.

3. The method for the production of a nitride-based semiconductor laser device according to claim 1, in which the insulating layer covers at least part of each of both side surfaces of the upper layer of the second cladding layer, and in which in the step (c), the insulating layer is formed such that it covers at least each of both side surfaces of the upper layer of the second cladding layer on the portions of the lower layer of the second cladding layer on which portions no upper layer of the second cladding layer is formed.

4. The method for the production of a nitride-based semiconductor laser device according to claim 1, in which in the step (c), a photoresist film is formed on the insulating layer after formation of the insulating layer on an upper surface of the insulating layer, such that the photoresist film has a smaller thickness above the second electrode and has a larger thickness above the portions of the lower layer of the second cladding layer on which portions no upper layer of the second cladding layer is formed, and then the photoresist film and the insulating layer at least on the second electrode are etched to expose at least the top surface of the second electrode.

5. The method for the production of a nitride-based semiconductor laser device according to claim 1, in which the thickness of a portion of the insulating layer formed on the portions of the lower layer of the second cladding layer which portions correspond to the top surface of the mesa structure is $5 \times 10^{-8}$ m to $3 \times 10^{-7}$ m.

6. The method for the production of a nitride-based semiconductor laser device according to claim 1, in which $0.4 T_{TOTAL} \leq T_{UPPER} \leq 0.9 T_{TOTAL}$ is satisfied where $T_{TOTAL}$ is a total thickness of the second cladding layer and $T_{UPPER}$ is a thickness of the upper layer of the second cladding layer.

7. The method for the production of a nitride-based semiconductor laser device according to claim 6, in which $0.05 T_{UPPER} \leq T_{INSL}$ is satisfied where $T_{INSL}$ is a thickness of a portion of the insulating layer which portion is formed on the portions of the lower layer of the second cladding layer which portions correspond to the top surface of the mesa structure.

8. The method for the production of a nitride-based semiconductor laser device according to claim 1, in which the insulating layer is made of at least one material selected from the group consisting of $SiO_2$, $SiN_x$, AlN, $Al_2O_3$, $Ta_2O_5$ and $ZrO_2$.

9. The method for the production of a nitride-based semiconductor laser device according to claim 1, in which the second electrode has a single-layered structure or a multi-layered structure containing at least one metal selected from the group consisting of palladium, platinum, nickel and gold, and the metal layer has a single-layered structure or a multi-layered structure containing at least one metal selected from the group consisting of platinum, titanium and nickel.

* * * * *